(12) United States Patent
Naylor, Jr.

(10) Patent No.: US 10,650,109 B1
(45) Date of Patent: May 12, 2020

(54) BOOLEAN SATISFIABILITY (SAT) SOLVER

(71) Applicant: Synopsys, Inc., Mountain View, CA (US)

(72) Inventor: William Clark Naylor, Jr., San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/264,098

(22) Filed: Jan. 31, 2019

Related U.S. Application Data (60) Provisional application No. 62/687,525, filed on Jun. 20, 2018.

(51) Int. Cl.
| | | |
|---|---|---|
| *G06F 17/50* | (2006.01) | |
| *G06F 17/11* | (2006.01) | |
| *G06F 17/15* | (2006.01) | |
| *G06F 17/17* | (2006.01) | |
| *G06N 20/00* | (2019.01) | |
| *G06N 5/04* | (2006.01) | |

(52) U.S. Cl.
CPC ............ *G06F 17/504* (2013.01); *G06N 5/04* (2013.01); *G06N 20/00* (2019.01); *G06F 17/11* (2013.01); *G06F 17/15* (2013.01); *G06F 17/17* (2013.01); *G06F 17/5009* (2013.01); *G06F 17/5022* (2013.01)

(58) Field of Classification Search
CPC ............ G06F 17/504; G06F 17/5009; G06F 17/5022; G06F 17/11; G06F 17/15; G06F 17/17; G06N 20/00; G06N 5/04

USPC ................ 716/106, 132; 703/2, 14
See application file for complete search history.

(56) References Cited

U.S. PATENT DOCUMENTS

| | | | |
|---|---|---|---|
| 7,740,942 B2 | 6/2010 | Ye et al. | |
| 7,742,907 B2 | 6/2010 | Gupta et al. | |
| 8,914,757 B1* | 12/2014 | Keidar-Barner | ........ G06F 17/10 703/16 |
| 9,454,466 B2* | 9/2016 | Ivrii | ....................... G06F 17/504 |
| 2004/0230407 A1* | 11/2004 | Gupta | ................... G06F 17/504 703/2 |
| 2011/0010139 A1* | 1/2011 | Fuhrmann | ............. G06F 17/504 703/2 |
| 2012/0272198 A1* | 10/2012 | Baumgartner | ........ G06F 17/505 716/107 |

OTHER PUBLICATIONS

Gomes et al., "Satisfiability Solvers", Chapter 2, Handbook of Knowledge Representation, Edited by F. van Harmelen et al., 2008, pp. 89-134. (Year: 2008).*

(Continued)

*Primary Examiner* — Phallaka Kik
(74) *Attorney, Agent, or Firm* — Park, Vaughan, Fleming & Dowler LLP; Laxman Sahasrabuddhe (57) ABSTRACT

Techniques and systems for solving a Boolean satisfiability (SAT) problem are described. Specifically, embodiments solve the SAT problem by generating an extended resolution proof. It is well-known that many technological problems can be modeled as SAT problems, and that solving an underlying SAT problem effectively solves the original technological problem. Therefore, embodiments described herein can be used to solve any technological problem that can be modeled as a SAT problem.

20 Claims, 3 Drawing Sheets

---

Construct a SAT problem based on a technological problem — 102

↓

Maintain a database that stores clauses that are used while solving the SAT problem — 104

↓

Solve the SAT problem, wherein said solving the SAT problem comprises generating an extended resolution proof — 106

↓

Use a solution of the SAT problem to solve the technological problem — 108

(56) References Cited

OTHER PUBLICATIONS

Jabbour et al., "Boolean Satisfiability for Sequence Mining", ACM, 2013, pp. 649-657. (Year: 2013).*
Klieber, Solvers for the Problem of Boolean Satisfiability (SAT), Aug. 31, 2011, 34 pages. (Year: 2011).*
Chan et al.; "Extension Heuristics for Extended Clause Learning", COMP 3006 Computer Science Research Project, Oct. 29, 2010.
Dantsin et al.; "A Faster Clause-Shortening Algorithm for SAT with No Restriction on Clause Length", Journal on Satisfiability, Boolean Modeling and Computation 1 (2005) 49-60.
Han et al.; "On-The-Fly Clause Improvement", University of Colorado at Boulder, 2009.
Heule et al.; "Bridging the Gap Between Easy Generation and Efficient Verification of Unsatisfiability Proofs", the University of Texas at Austin, 2014.
Heule et al.; "Trimming while Checking Clausal Proofs", The University of Texas at Austin, Formal Methods in Computer-Aided Design (FMCAD), Portland, Oregon, Oct. 23, 2013.
Heule et al. "Verifying Refutations with Extended Resolution", The University of Texas at Austin, 2013.
Jussila et al.; "Extended Resolution Proofs for Symbolic SAT Solving with Quantification", Institute for Formal Models and Verifications, Johannes Kepler University Linz, Austria, 2006.
Nadel et al.; "Accelerated Deletion-based Extraction of Minimal Unsatisfiable Cores", Journal on Satisfiability, Boolean Modeling and Computation 9 (2014) 27-51.
Manthey; "Improving SAT Solvers Using State-of-the-Art Techniques", Technische Universitat Dresden, Dec. 15, 2010.
Chvatal et al; "Many Hard Examples for Resolution" Journal of the Association for Computing Machinery, vol. 35, No. 4, Oct. 1988, pp. 759-768.
Marques-Silva et al; "GRASP: A Search Algorithm for Propositional Satisfiability" IEEE Transactions on Computers, vol. 48, No. 5 May 1999.
Marques-Silva; "Pratical Applications of Boolean Satisfiability" Proceedings of the 9th International Workshop on Discrete Event Systems, 2008.
Moskewicz et al; "Chaff: Engineering an Efficient SAT Solver", DAC 2001, Jun. 18-22, 2001, Las Vegas, Nevada.
Urquhart; "Hard Examples for Resolution", Journal of the Association for Computing Machinery, vol. 34, No. 1, Jan. 1987, pp. 209-219.
Urquhart; "The Complexity of Propositional Proofs", The Bulletin of Symbolic Logic, vol. 1, No. 4, Dec. 1995.

* cited by examiner

BOOLEAN SATISFIABILITY (SAT) SOLVER

RELATED APPLICATION

This application claims benefit of U.S. Provisional Application Ser. No. 62/687,525, filed on 20 Jun. 2018, having the same inventor, the contents of which are herein incorporated by reference in their entirety for all purposes.

BACKGROUND

Technical Field

This disclosure relates to solving Boolean satisfiability (SAT) problems. More specifically, this disclosure relates to a SAT solver that uses extended-resolution proof language to improve performance.

Related Art

The phase of a Boolean variable refers to whether the variable appears as is or as a negation. For example, the Boolean variable "x" has two possible phases, namely, positive phase "x" and negative phase "!x." A literal is a Boolean variable in either phase. When the phase is positive, e.g., "x," the literal is called a positive literal, and when the phase is negative, e.g., "!x," the literal is called a negative literal. A clause is a disjunction of literals or a single literal. For example, $(x_1|!x_2|x_3)$ is a clause that is defined over Boolean variables $x_1$, $x_2$, and $x_3$. The length of a clause is equal to the number of literals in the clause. For example, the clause $(x_1|!x_2|x_3)$ is a clause of length 3 or a length-3 clause.

Given a set of clauses $C_1, C_2, \ldots C_m$, which are defined over one or more Boolean variables $x_1$, $x_2$, and $x_n$, the Boolean satisfiability (SAT) problem is to determine whether or not an assignment of TRUE/FALSE values to the Boolean variables exists that causes the conjunction of the clauses, i.e., the formula $C_1 \cdot C_2 \cdot \ldots C_m$, to evaluate to TRUE.

A SAT solver is a software application or module that solves SAT problems. SAT solvers have numerous applications, e.g., see João P. Marques-Silva, "Practical applications of Boolean satisfiability," Proceedings of the 9th International Workshop on Discrete Event Systems, 2008. Specifically, SAT solvers are commonly used in an integrated circuit (IC) design flow, including, but not limited to, combinational equivalence checking, automatic test-pattern generation, model checking, and routing. Other applications include planning in artificial intelligence, and haplotyping in bioinformatics. In general, any technological problem that can be modeled as a SAT problem can be solved by using a SAT solver. A SAT problem is said to have been solved when a SAT solver either (1) finds a variable assignment that satisfies the formula, or (2) proves that the SAT problem is unsatisfiable.

Existing SAT solvers can have poor performance for certain SAT problems. Specifically, existing SAT solvers can time out, i.e., they may fail to find a solution and fail to prove that no solution exists within a reasonable amount of time. The "P versus NP problem" is arguably the most important unsolved problem in computer science, and SAT is a well-known NP-complete problem. If one creates a SAT solver that can solve any SAT problem in worst-case polynomial time, then that would imply that "P=NP," thereby solving this important unsolved problem in computer science. Therefore, what are needed are techniques and systems for improving the performance of SAT solvers.

SUMMARY

Some embodiments described herein provide techniques and systems (e.g., a SAT solver) for solving a SAT problem. Some embodiments maintain a database that stores clauses that are used while solving the SAT problem. In some embodiments, the SAT problem is solved by generating an extended resolution proof, where each new variable is defined as the Boolean OR of a pair of literals involving existing variables, and the pair of literals is chosen as the most common pair occurring in the clauses in the database.

In some embodiments, the new variables are substituted for pairs of literals in clauses in the database whenever possible. In some embodiments, conflict-driven-clause learning is used to derive new clauses by resolution. In some embodiments, the phase of the branched literals is chosen randomly. In some embodiments, the phase of the branched literals is chosen to satisfy the maximum number of clauses in the database.

In some embodiments, loop resolution is used to derive new clauses by resolution. In some embodiments, redundancy of a proposed new clause is tested, and the new clause is not added if it is found to be redundant. In some embodiments, redundancy of a proposed new clause is tested against only length-2 and original problem clauses. In some embodiments, redundancy of a proposed new clause is tested against only length-2, length-3, and original problem clauses.

In some embodiments that use loop resolution, the search for loops is done by expansion from clauses in the database. In some embodiments, the clauses to be expanded are managed by a priority queue, sorted by a metric that indicates the desirability of expanding the clauses. In some embodiments, the desirability metric includes the size of the clause to be generated. In some embodiments, the desirability metric includes the size of the clause to be expanded. In some embodiments, the desirability metric includes the position of the clause to be expanded in the proof being generated. In some embodiments, the desirability metric includes a random factor.

In some embodiments, new variables are defined only when a resolution method fails to generate clauses of a predefined type. In some embodiments, new variables are defined only when a resolution method fails to generate clauses of a predefined length or smaller. In some embodiments, new variables are defined only when a resolution method fails to generate clauses of length 2 or smaller. In some embodiments, new variables are defined only when a resolution method fails to generate clauses of length 3 or smaller.

In some embodiments, the SAT problem is solved by generating an extended resolution proof, where new variables are defined only when a resolution method fails to generate clauses of a predefined type at a sufficient rate. In some embodiments, new variables are defined only when a resolution method fails to generate clauses of a predefined length or smaller at a sufficient rate. In some embodiments, new variables are defined only when a resolution method fails to generate clauses of length 2 or smaller at a sufficient rate. In some embodiments, new variables are defined only when a resolution method fails to generate clauses of length 3 or smaller at a sufficient rate.

In some embodiments, literal equalities are proved and used to substitute out equal literals. In some embodiments, literal clause shortening is used to remove superfluous literals from clauses.

Some embodiments were used to solve hard SAT problems of different sizes. If N is the problem size as measured by the number of clauses in the SAT problem, then the results indicated that (1) the pigeonhole SAT problem was solved in runtime $O(N^{5.4})$, (2) XOR reorder SAT problem was solved in runtime $O(N^6)$, and (3) the randomized multiplier equivalence SAT problem was solved in runtime $O(N^{9.7})$.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Solving a Technological Problem by Using a SAT Solver

Figure 1:
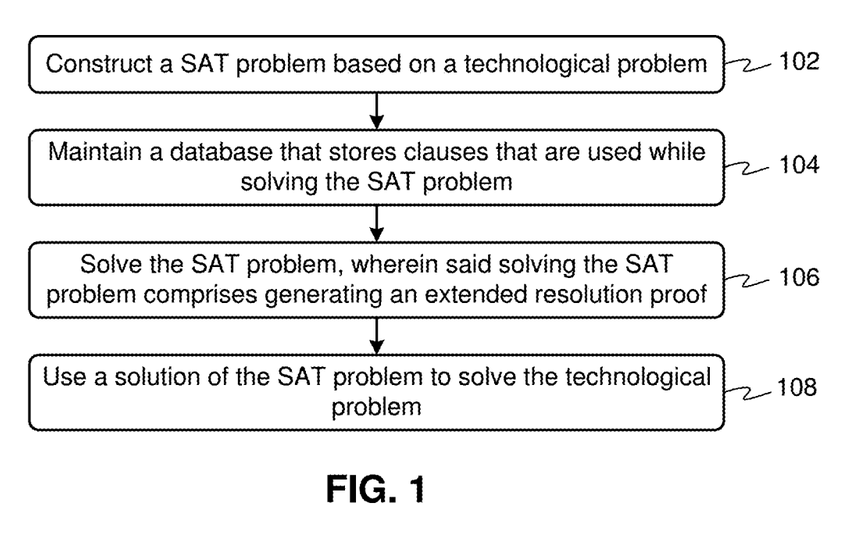
FIG. 1 illustrates a process for solving a technological problem by using a SAT solver in accordance with some embodiments described herein.

FIG. 1 illustrates a process for solving a technological problem by using a SAT solver in accordance with some embodiments described herein. The process can begin by constructing a SAT problem based on a technological problem (step 102). The process can maintain a database that stores clauses that are used while solving the SAT problem (step 104). Next, the process can solve the SAT problem, wherein said solving the SAT problem comprises generating an extended resolution proof (step 106). Further details on how a SAT problem can be efficiently solved by generating extended resolution proofs is provided below in the section entitled "SAT Solver." The process can then use the solution of the SAT problem to solve the technological problem (step 108). Specifically, when the SAT problem is constructed from a technological problem, it explicitly or implicitly maps variables in the technological problem to variables in the SAT problem. Once a solution to the SAT problem has been found, a reverse mapping can be used to convert the SAT solution into a solution for the technological problem. Techniques for constructing SAT problems from technological problems, and for converting solutions of the SAT problems into solutions of the technological problems are well-known in the art.

Note that techniques for constructing a SAT problem based on a technological problem (step 102), and then using the solution of the SAT problem to determine a solution of the technological problem (step 108) are well-known, e.g., see João P. Marques-Silva, "Practical applications of Boolean satisfiability," Proceedings of the 9th International Workshop on Discrete Event Systems, 2008. The technological problems described in this disclosure are for illustration purposes only, and are not intended to limit the scope of the disclosure.

Figure 2:
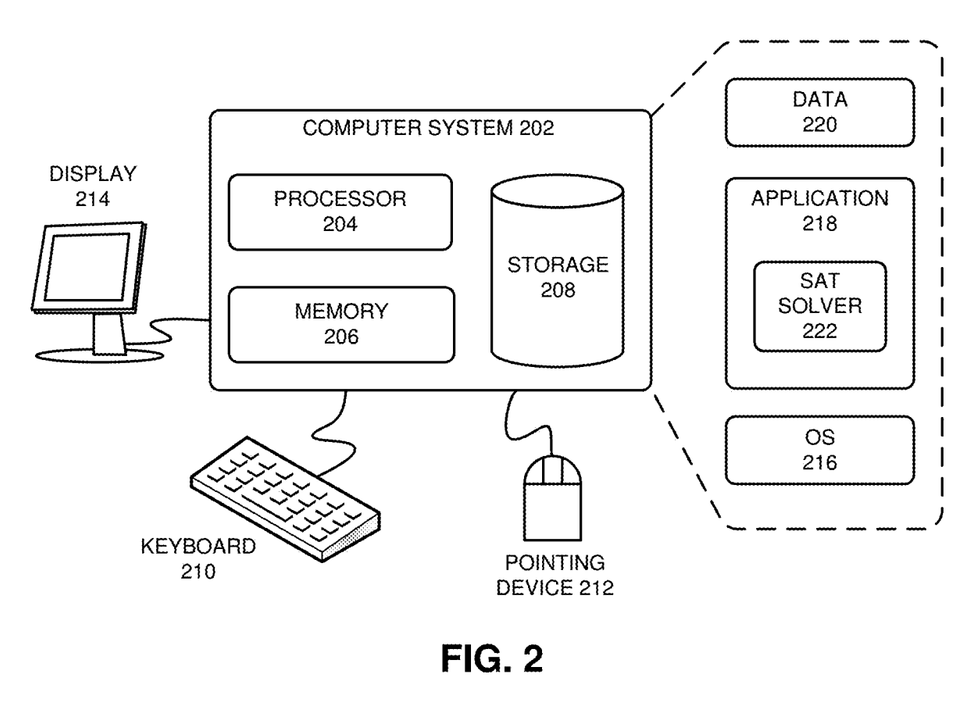
FIG. 2 illustrates a computer system in accordance with some embodiments described herein.

FIG. 2 illustrates a computer system in accordance with some embodiments described herein. Computer system 202 can include processor 204, memory 206, and storage device 208. Specifically, memory locations in memory 206 are addressable by processor 204, thereby enabling processor 204 to access (e.g., via load/store instructions) and manipulate (e.g., via logical/floating point/arithmetic instructions) the data stored in memory 206. Computer system 202 can be coupled to display device 214, keyboard 210, and pointing device 212. Storage device 202 can store operating system 216, application 218, which includes SAT solver 222 (e.g., the DeepSAT solver described below), and data 220. Data 220 can include input required by application 218 and/or output generated by application 218.

Computer system 202 may automatically (or with user help) perform one or more operations that are implicitly or explicitly described in this disclosure. Specifically, computer system 202 can load application 218 into memory 206, and application 218 can then be used to solve a technological problem, which involves solving a SAT problem using SAT solver 222 (which implements techniques and systems described in this disclosure). As explained below, embodiments described herein can substantially improve the performance of a SAT solver which, in turn, substantially improves the performance of the application that is being used to solve the technological problem.

As one example, an IC design and manufacturing process includes multiple technological problems that can be solved by using a SAT solver. In an IC design and manufacturing process, IC design software tools can be used to create an IC design. Once the IC design is finalized, it can undergo fabrication, packaging, and assembly to produce IC chips. The overall IC design and manufacturing process can involve multiple entities, e.g., one company may create the software for designing ICs, another company may use the software to create the IC design, and yet another company may manufacture IC chips based on the IC design. An IC design flow can include multiple steps, and each step can involve using one or more IC design software tools. An improvement to one or more of these steps in the IC design flow results in an improvement to the overall IC design and manufacturing process. Specifically, the improved IC design and manufacturing process can produce IC chips with a shorter time-to-market (TTM) and/or higher quality of results (QoR).

An IC design can be represented by using different data formats or languages as the IC design progresses through an IC design flow, wherein the different data formats or languages represent the IC design at different levels of abstraction. In general, higher levels of abstraction contain fewer details of the IC design than lower levels of abstraction. Typically, the IC design is described at a high level of abstraction in the early stages of the IC design flow, and the level of abstraction becomes progressively lower as the IC design moves through the IC design flow (the description of the IC design becomes more specific as the IC design progresses through the IC design flow).

For example, toward the beginning of the IC design flow, an IC design can be described at a high level of abstraction by using a hardware description language (HDL) which describes the functionality of the IC design but does not provide any information about the actual geometric shapes that will be printed on the wafer. Toward the end of the IC design flow, the same IC design can be represented in a low level of abstraction by using a data format or language such as GDSII or OASIS, which contains a description of the actual geometric shapes that are to be printed on the wafer. In between the two ends of the IC design flow, the IC design may be represented in numerous data formats or languages that describe the same IC design at different levels of abstraction.

Some examples of IC design steps and the associated software tools are described below. These examples are for illustrative purposes only and are not intended to limit the embodiments to the forms disclosed. This disclosure describes embodiments that can be used in one or more IC design steps.

IC design software tools enable IC designers to describe the functionality that the IC designers want to implement. These tools also enable IC designers to perform what-if planning to refine functionality, check costs, etc. During logic design and functional verification, the HDL, e.g., SystemVerilog, code can be written and the design can be checked for functional accuracy, e.g., the design can be checked to ensure that it produces the correct outputs.

During synthesis and design for test, the HDL code can be translated to a netlist using one or more IC design software tools. Further, the netlist can be optimized for the target technology, and tests can be designed and implemented to check the finished chips. During netlist verification, the netlist can be checked for compliance with timing constraints and for correspondence (i.e., equivalence checking) with the RTL design and/or HDL code.

During design planning, an overall floorplan for the chip can be constructed and analyzed for timing and top-level routing. During physical implementation, circuit elements can be positioned in the layout and can be electrically connected.

During analysis and extraction, the IC design's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication to produce IC chips. There are many technological problems in an IC design and manufacturing process that can be solved by using a SAT solver. These include, but are not limited to, combinational equivalence checking, automatic test-pattern generation, model checking, and routing.

Figure 3:
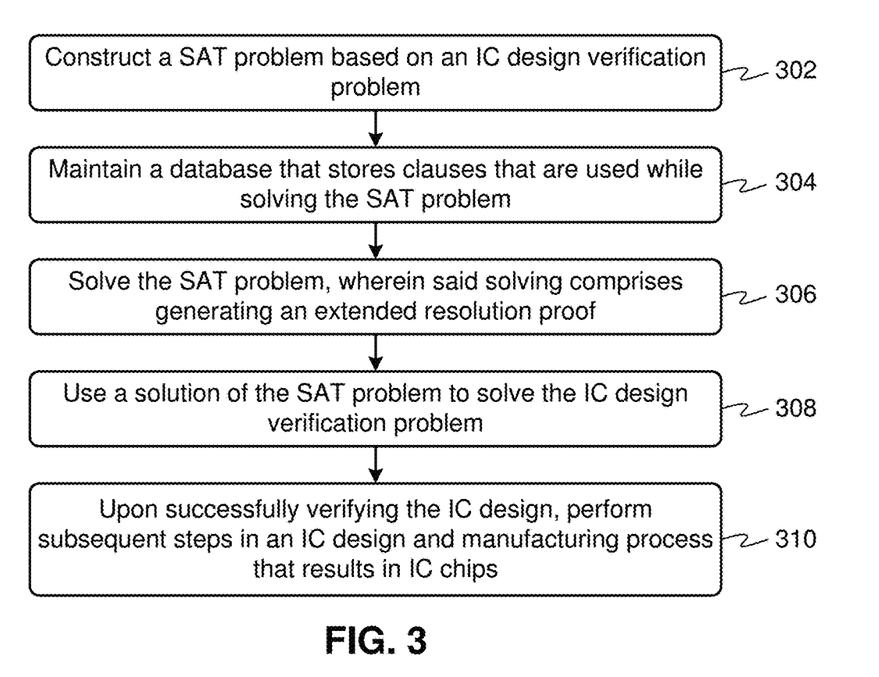
FIG. 3 illustrates a process for solving an IC design verification problem by using a SAT solver in accordance with some embodiments described herein.

FIG. 3 illustrates a process for solving an IC design verification problem by using a SAT solver in accordance with some embodiments described herein. The process can begin by constructing a SAT problem based on an IC design verification problem (step 302). Note that the process can maintain a database that stores clauses that are used while solving the SAT problem (step 304). The process can then solve the SAT problem, wherein said solving comprises generating an extended resolution proof (step 306). Next, the process can use the solution of the SAT problem to solve the IC design verification problem (step 308). Upon successfully verifying the IC design, the process can then perform subsequent steps in an IC design and manufacturing process that results in IC chips (step 310).

SAT Solver

Embodiments described herein feature a SAT solver that can solve SAT problems in significantly less time than traditional SAT solvers. In fact, in many instances the SAT solver described herein finds solutions while traditional solvers time out, i.e., they are unable to find a solution in a reasonable amount of time. "DeepSAT" is the name of a software embodiment that uses techniques described in this disclosure to solve SAT problems. It will be evident to those skilled in the art that features that are described in the context of DeepSAT can be applied to other embodiments and applications without departing from the spirit and scope of the present invention. Some of the description herein relates to SAT solvers in the context of IC design and manufacturing. However, it will be evident to a person having ordinary skill in the art that the description can generally be used to solve any SAT problem in any technological context.

DeepSAT generalizes the traditional conflict-driven clause learning by introducing new variables during the run. The superior performance of DeepSAT results from the greater power of the extended-resolution proof language (used by DeepSAT) versus the resolution proof language (used by traditional solvers). DeepSAT consumes a satisfiability problem expressed as a product-of-sums. For example, consider the following satisfiability problem:

(A|B|C)&(!C|D|E)&(B|D|G)& . . . .

In the above formula, the capital letters are Boolean variables, "|" means Boolean OR, "&" means Boolean AND, "!" means Boolean NOT. Additionally, !FALSE=TRUE, !TRUE=FALSE. Also, FALSE|FALSE=FALSE, all other combinations evaluate to TRUE. Finally, TRUE&TRUE=TRUE, and all other combinations evaluate to FALSE.

DeepSAT must either find assignments of TRUE or FALSE to all of the variables to make the entire Boolean expression TRUE, or else DeepSAT must prove that no such assignment exists. Note that for the entire expression to be TRUE, each clause must be TRUE. DeepSAT maintains a database to store clauses that are used during runtime.

DeepSAT attempts to construct a refutation, i.e., a formal proof that no variable assignment makes all clauses TRUE. The refutation is expressed in a formal language called "extended resolution." Extended resolution derives a new clause from two existing clauses by performing a resolution step.

For example, note that C and !C appear in the clauses "(A|B|C)" and "(!C|D|E)." Now, if C==TRUE, then !C must be FALSE, so D|E must be TRUE. Alternatively, if C==FALSE, then A|B must be TRUE. Thus, "(A|B|D|E)" must be TRUE. So, we can derive "(A|B|D|E)" from the two clauses (A|B|C) and (!C|D|E). That is, "(A|B|C)&(!C|D|E)→(A|B|D|E)." This is an example of a resolution step.

Conflict-driven-clause-learning is a method of proving new clauses by performing several resolution steps (further details are provided below). A sequence of resolution steps that derives the empty clause is a refutation. For example, consider the following SAT problem:

(A|B)&(B|C)&(A|C)&(!A|!B)&(!A|!B)&(!A|!C)

The above SAT problem has the following resolution refutation. Each line in the following proof has the following format: "<label><statement><reason>." For example, "(1)" is an example of a label, "A|B" is an example of a statement, and "axiom" is an example of a reason. In the following proof, labels (1)-(6) define the SAT problem, and labels (7)-(11) provide the refutation.

/*definition of SAT problem*/
(1) A|B—axiom;
(2) B|C—axiom;
(3) A|C—axiom;
(4) !A|!B—axiom;
(5) !B|!C—axiom;
(6) !A|!C—axiom;
/*proof (refutation)*/
(7) B|!C—resolve (1), (6);
(8) B—resolve (2), (7);
(9) !B|C—resolve (3), (4);
(10) !B—resolve (5), (9);
(11) <CONTRADICTION>—resolve (8), (10);

Extended resolution also allows definition of new variables in terms of existing variables, in order to aid in constructing a resolution refutation. DeepSAT defines new variables as OR of 2 existing variables or their inverses. For example, DeepSAT can define the new variable NEWVAR1 as follows:

define NEWVAR1=B|!D.

Specifically, DeepSAT defines the new variable by entering three new clauses into its clause database, which for this example are: "(NEWVAR1|!B)&(NEWVAR1|D)&(!NEW_VAR|B|!D)." Further details and examples of how new variables can be defined can be found in G. S. Tseitin, "On the complexity of derivations in the propositional calculus," Studies in Mathematics and Mathematical Logic, Part II, A. O. Slisenko, ed., 1970, pp. 115-125.

Many satisfiability problem classes require exponential length refutations in resolution. For example, see (1) Alasdair Urquhart, "Hard Examples for Resolution," Journal of the ACM, Vol 34, 1987, pp 209-219, (2) Vasek Chvatal and Endre Szemeredi, "Many Hard Examples for Resolution," Journal of the ACM, vol 35 (1988), pp. 759-768, and (3) Alasdair Urquhart, "The Complexity of Propositional Proofs," in The Bulletin of Symbolic Logic, Volume 1, Number 4, December 1995, pages 425-467. To the best of the inventor's knowledge, no fully proved result showing that any satisfiability problem class requires an exponential length refutation in extended resolution is known.

The length of the shortest possible refutation is important, because a process which solves a SAT problem must write a refutation, either implicitly or explicitly, in order to be correct for unsatisfiable problems. If the length of the shortest refutation is exponential, then just writing the refutation requires exponential time, without even counting the time to find the refutation, so we can have no hope of a sub-exponential runtime process. Problem classes known to require exponential length refutations in resolution include the pigeonhole problem, XOR reordering equivalence problem, and multiplier equivalence problem. But these same problem classes have polynomial-sized refutations in extended resolution.

It can be argued that the length of a refutation produced by DeepSAT is polynomial in the length of the shortest possible refutation. Since DeepSAT uses polynomial time to produce each step in the refutation, DeepSAT runs in time polynomial in the length of the shortest refutation. Benchmark data shows that performance of DeepSAT is superior to traditional solvers on the hardest problems, and that the growth of the runtime with respect to proof size is polynomial, as predicted by the theory.

DeepSAT uses conflict driven clause learning in a manner similar to the "Chaff" approach described in M. Moskewicz, C. Madigan, Y. Zhao, L. Zhang, S. Malik, "Chaff: Engineering an Efficient SAT Solver," 39th Design Automation Conference (DAC 2001), Las Vegas, A C M 2001, to prove new clauses (a brief discussion of conflict-driven clause learning is provided below, and further details can be found in the above-mentioned research paper on "Chaff").

Conflict-driven clause learning is an effective method to search for a resolution refutation and a satisfying variable assignment simultaneously. DeepSAT is similar to Chaff in using variable activity to choose which variable to branch, and using 2-watched-literal process for implication propagation. However, unlike Chaff, DeepSAT chooses the variable phase randomly rather than by activity. This difference seems to be very important for generating new variables effectively.

In addition to conflict-driven clause learning, DeepSAT identifies length-1 and length-2 clauses to prove by searching cycles in length-2 and length-3 clauses, the details of which are described below. Recall that the length of a clause is equal to the number of literals in the clause. For example, the clause "(A|B)" is a clause of length 2 or a length-2 clause. After running conflict-driven clause learning for number of steps of order the number of literals in the clause database, DeepSAT stops to do several O(N) runtime operations, which are also described below. After performing these O(N) operations, DeepSAT resumes conflict-driven-clause-learning.

New Variable Handling

The most important of the above-mentioned O(N) operations is handling of new variables. DeepSAT defines a new variable as the logical OR of 2 previously existing variables, for example "NEW_VARIABLE=A|!C." As explained above, DeepSAT defines the new variable by entering 3 new clauses into its clause database which, for this example, are:

(NEWVAR1|C) & (NEWVAR1|!A) & (!NEW_VAR|A|!C).

Specifically, DeepSAT first examines all clauses to see if any clauses contain pairs of literals defining new variables. When found, the new variable is substituted. For example, if the clause database contains the clause "(A|!B|!C)," then DeepSAT would substitute in the new variable, yielding the clause "(NEW_VARIABLE|!B)."

Next, DeepSAT considers defining new variables. If during the preceding conflict-driven-clause learning run, no length-2, literal assertions, or literal equalities were proved, then DeepSAT defines a new variable. To decide which literals to OR together to define the new variable, DeepSAT queries its clause database to find which pairs of literals are most common. This is the maximum compression heuristic. After defining the new variable, DeepSAT substitutes the new variable into all possible clauses in the database.

The goal of new variable definition is to keep the clauses compressed so that conflict-driven-learning proves at least one length-2 literal assertion or literal equality during the conflict-driven-clause-learning pass. If defining 1 new variable is insufficient to keep DeepSAT proving these, DeepSAT defines 2 new variables in the next pass. If this is still insufficient, DeepSAT defines 4 new variables in the next pass, and so forth.

Equality Collapsing

Equal literals can confuse DeepSAT's maximum compression heuristic by distorting the literal pair count used to choose the literals for the new variables. So it is important to find and remove equal literals. DeepSAT uses an O(N) runtime depth-first search technique to find all equalities implied by length-2 clause loops, and then substitutes out equal literals from all clauses in the database. For example, the length-2 clause loop "(A|B) & (!B|C) & (!C|!A)" implies "A !B !C."

Clause Shortening

Clauses that are longer than they need to be can confuse DeepSAT's maximum compression heuristic for new variable generation, because these clauses introduce literal pairs into the literal pair count that should not be in the count. The traditional conflict-driven-clause-learning method often generates clauses that have unneeded literals. Also, as the clause database grows and its implicativity strengthens, many clauses contain literals which are redundant with respect to the entire clause database, and thus these literals can be removed and thus the clauses shortened. The following sections describe how DeepSAT handles these two issues.

Conflict-Driven-Clause-Learning Clause Shortening

When conflict-driven-clause-learning generates a new clause, DeepSAT follows the implication directed acyclic graph (DAG) that leads to each literal of the new clause. If for a literal, the implication DAG leading to that literal has a cut composed entirely of other literals of the new clause, then the literal is deleted from the new clause. Implication DAGs are well known in the SAT art, and further details can be found in João P. Marques-Silva, Karem A. Sakallah, "GRASP: A Search Algorithm for Propositional Satisfiability," *IEEE Transactions on Computers*, v. 48 n. 5, p. 506-521, May 1999.

General Clause Shortening

Periodically, DeepSAT randomly selects clauses in its clause database to be shortened. The clause to be shortened is temporarily removed from the clause database. DeepSAT then sets variables to falsify literals of the clause. The variables are selected in random order. If implication propagation (BCP) forces any literal of the clause to be TRUE or FALSE, then the clause is shortened.

For example, suppose the database contains the clause "(A|B|C|D|E)." Now, suppose DeepSAT sets "A=FALSE," "B=FALSE," and "C=FALSE," and the implication propagation through the clause database yields "D=TRUE." Then, in this situation, literal E can be deleted from the clause. Next, if DeepSAT backtraces through the implication propagation DAG, and DeepSAT discovers that "B=FALSE" is not necessary to derive "D=TRUE," then DeepSAT can delete literal B from the clause as well. On the other hand, if setting "A=FALSE," "B=FALSE," and "C=FALSE," yields "D=FALSE" by implication propagation, then DeepSAT can delete D from the clause.

Finally, if setting "A=FALSE," "B=FALSE," and "C=FALSE," in that order yields a conflict, then DeepSAT can delete variables D and E from the clause. Next, if DeepSAT backtraces through the implication propagation DAG, and it discovers that "B=FALSE" is not necessary to derive the conflict, then DeepSAT can delete literal B from the clause as well. If a conflict is found during implication propagation, then a conflict clause is added to the clause database.

Clause Deletion

The presence of redundant clauses bloats memory usage and increases runtime but, most importantly, distorts the literal pair count, which confuses the max compression heuristic for generating new variables. So it is important to delete redundant clauses as rapidly as possible. Of course, DeepSAT never deletes clauses from the original problem definition, nor clauses needed to define new variables. DeepSAT deletes clauses in two different ways: (1) DeepSAT attempts to prove length-2, 3, and 4 clauses redundant, and deletes the clause if it is redundant, and (2) DeepSAT keeps activity counts on length-4 and above clauses, and deletes the clauses if their activity count is too small. The following paragraphs provide further details on how clauses are deleted.

Deletion of Length-2, Length-3, and Length-4 Clauses

Periodically, DeepSAT tests all length-4 clauses (recall that a length-4 clause is a clause that has 4 literals) and smaller for redundancy. DeepSAT starts with longest clauses first, and proceeds in random order for clauses of the same length. As an example of how DeepSAT tests for clause redundancy, suppose the length-3 clause "(A|B|C)" is in DeepSAT's clause database. DeepSAT temporarily removes the clause from its database, then sets variables from the clause to test implicativity of the clause database minus the tested clause. If setting "A=FALSE" and "B=FALSE" yields "C=TRUE," and "A=FALSE" and "C=FALSE" implies "B=TRUE," and "B=FALSE" and "C=FALSE" implies "A=TRUE," then the clause "(A|B|C)" is redundant and DeepSAT deletes it.

DeepSAT does similar tests for length-2 and length-4 clauses. While doing these tests for clause deletion, DeepSAT records information which sometimes implies equalities or proved literal values. For example, if during testing described above, DeepSAT notices that "A=FALSE" implies "B=FALSE," and "A=TRUE" implies B=TRUE," then it follows that "A=B." On the other hand, if "A=FALSE" implies "B=FALSE," and "A=TRUE" implies "B=FALSE," then it follows that "B=FALSE."

Deletion of Length-4 and Longer Clauses

DeepSAT deletes enough length-4 and longer clauses to keep the runtime spent doing implication propagation through length-4 and longer clauses no more than the runtime spent doing implication propagation through length-3 and smaller clauses. The metric DeepSAT uses to decide which clauses to delete is: value_of_clause=1/(time_since_last_propagation_through_clause×clause_length). Once the values for the clauses have been computed, DeepSAT deletes clauses with the smallest value_of_clause first.

Restarts

A "restart" is an interruption of conflict-driven clause learning where all variable settings get backtracked, and then variable setting resumes from scratch. DeepSAT has relatively frequent restarts. DeepSAT measures the runtime from the last restart until the first conflict. DeepSAT does another restart when the runtime exceeds 10× the runtime until the first conflict. The activity count used to select variables to branch is retained during restarts. After a runtime of approximately 500 times the number of literals, the activity count is reset to 0. For restarts, the runtime is measured in terms of the number of clause visits during implication propagation. These resets are to prevent DeepSAT from getting stuck on one part of the problem.

Additional Details for Handling Length-2 Clauses

Length-2 clauses play a special role in DeepSAT. Random selection of variable phase during branching, random ordering of variable branching during clause shortening give a high probability of proving most of the length-2 clauses that can be proved directly by resolution from other length-2 and length-3 clauses of high or moderate activity, with no longer clauses proven as intermediate steps.

As discussed above, DeepSAT defines new variables only if it is unable to prove any length-1, length-2, or length-3 clauses during a pass of conflict-driven-clause-learning. It is interesting that when DeepSAT runs on problems that traditional solvers can solve, DeepSAT usually does not need to introduce any new variables to solve the problem. If DeepSAT does not need to introduce any new variables, then DeepSAT provably runs in polynomial time, because it must terminate after proving $O(N^2)$ length-2 or shorter clauses.

Introducing new variables more often than described above can cause a SAT solver to get stuck on some SAT problems. The difficulty seems to be that the SAT solver proves many clauses relating the new variable definitions to each other, but not enough regarding the underlying SAT problem. Waiting until DeepSAT has proved all length-1, length-2 clauses possible before introducing new variables forces DeepSAT to prove length-2 and shorter clauses regarding the underlying SAT problem if it is possible to do so.

Conflict-Driven Clause Learning

Conflict-driven clause learning is the main process used by modern satisfiability solvers such as "CHAFF" and "MINISAT2," see e.g., M. Moskewicz, C. Madigan, Y. Zhao, L. Zhang, and S. Malik, "Chaff: Engineering an Efficient SAT Solver," 39th Design Automation Conference (DAC 2001), Las Vegas, A C M 2001. Conflict-driven-clause learning is an effective method to search for a resolution refutation and a satisfying variable assignment simultaneously.

Conflict-driven clause learning works by repeatedly setting values to variables and then propagating the implications of these settings. DeepSAT chooses the variable with the highest activity count to branch first (details on activity count explained below). DeepSAT decides whether to set the variable TRUE or FALSE randomly. Then the implications of the variable setting are propagated (called "binary-constraint-propagation" or "BCP" in the literature). After all implications are propagated, one of the following happens:

1) All clauses are satisfied (that is, all clauses are TRUE). DeepSAT terminates and outputs the satisfying variable assignment it has found.
2) Implication propagation leads to an inconsistency in implied setting for a variable (called a "conflict" in the literature). Analysis of the implication DAG implies a new clause, which is added to the clause database, and will prevent this conflict from ever occurring again (the clause is called a "conflict clause" in the literature). Then DeepSAT backtracks the variable settings until the conflict clause is no longer falsified and the conflict clause no longer implies variable setting. And then DeepSAT resumes setting variables.
3) Neither of the above. In this case, DeepSAT continues assigning values to variables.

As conflict clauses accumulate, fewer and fewer variables need to be set to lead to a conflict. If a satisfying assignment is not eventually found, then we reach the condition that setting a single variable alone leads to a conflict, and then setting the same variable to the opposite value also leads to a conflict. When this happens, DeepSAT terminates and reports that the problem is unsatisfiable. A few examples to show how conflict-driven clause learning works are now discussed.

Example in which Above-Mentioned Condition #1 Occurs

Consider the following three clauses: "(A|B|C) & (!C|D|E) & (A|!E|F). Assume we first branch "B=FALSE," and nothing happens, so we keep branching. Assume we next branch "D=FALSE." Again, nothing happens, so we keep branching. Assume we next branch "A=FALSE." Now, since "A=FALSE" and "B=FALSE," the clause "(A|B|C)" implies that "C=TRUE." Since "C=TRUE," "!C=FALSE," and we previously branched "D=FALSE," so clause "(!C|D|E)" implies "E=TRUE." Now, since "E=TRUE,"

"!E=FALSE," and we previously branched "A=FALSE," so clause "(A|!E|F)" implies "F=TRUE."

Now all clauses are true, so DeepSAT terminates and reports the following satisfying variable assignment: "A=FALSE," "B=FALSE," "C=TRUE," "D=FALSE," "E=TRUE," and "F=FALSE."

Example in which Above-Mentioned Condition #2 Occurs

Again consider these three clauses: "(A|B|C) & (!C|D|E) & (A|!E|F)." Now we consider a different variable setting pattern. Assume previously we have branched "B=FALSE," "D=FALSE," and "F=FALSE." Now assume we branch "A=FALSE." Since "A=FALSE" and "B=FALSE," so clause "(A|B|C)" implies "C=TRUE." Since "C=TRUE," "!C=FALSE," and we previously branched "D=FALSE," so clause "(!C|D|E)" implies "E=TRUE." But since "A=FALSE" and "F=FALSE," so clause "(A|!E|F)" implies "!E=TRUE" which, in turn, implies "E=FALSE."

We now have an implication conflict, because one implication path proves "E=FALSE," and another proves "E=TRUE." Backtracing from the conflict, we discover that once "B=FALSE," "D=FALSE," and "F=FALSE," setting "A=FALSE" inevitably leads to the conflict by implication propagation. Thus, if "B=FALSE," "D=FALSE," "F=FALSE," then we must have "A=TRUE."

The clause which directly enforces this by implication propagation is "(A|B|D|F)" so we add this new clause to the clause database, which ensures that this conflict can never occur again. To add this clause to the database but not have it be false, we must backtrack setting A. To have the clause not immediately cause an implication, we must also backtrack setting F.

All variables involved in the conflict have their activity count incremented. Variables with the highest activity count get branched first. Older activity counts less than recent activity. Note that clause "(A|B|D|F)" can be derived from the other clauses by resolution.

Loop Resolution

DeepSAT searches for cycles in the clause structure of length-2 and length-3 clauses which imply length-1 and length-2 clauses. If a length-1 clause gets proved, its implications are propagated by BCP. If a length-2 clause get proved, DeepSAT checks the new clause for redundancy against length-2 and length-3 clauses already in the database. The redundancy check is the same as described above in reference to deletion of length-2, length-3, and length-4 clauses.

Clause Loop Implying Length-1 Clause

A cycle of length-2 clauses with inverted literals between pairs of clauses adjacent in the cycle except one pair which is same phase implies a length-1 clauses. For example, the clause "(A|B) & (!B|C) & (!C|A)" implies "A=TRUE."

Clause Loop Implying Length-2 Clause

A similar processing can be performed for a cycle of clauses as above but with one of the clauses being length-3 implies a length-2 clause. For example, the clause "(A|B) & (!B|C|D) & (!C|A)" implies "(A|D)."

Search Process

First loops implying length-1 clauses are searched. When no more length-1 loops remain, then loops implying length-2 clauses are searched. When no loops implying length-1 or length-2 clauses remain, the process reports the search is complete.

DeepSAT keeps length-2 and length-3 clauses in a priority queue. Clauses get popped off the queue to be expanded. Expanding a clause means that DeepSAT finds all loops which can prove clauses using the popped clause. Expanding searches for either length-1 clause loops, or length-2 or shorter clause loops. The priority queue stores clauses sorted by type of search. Clauses due for length-1 search pop first. After the clause is expanded for length-1, the clause is re-inserted into the queue for length-2 search. After the clause is expanded for length-2, the clause is removed from the queue.

When the queue becomes empty, the process reports that the search is complete. Initially, all clauses go into the queue labelled for the smallest loop that can be searched from the clauses. Length-2 clause can expand for length-1 loops; length-3 clause can expand for length-2 loops. When a new clause is proved, either by loop resolution, or by other means, the clause is inserted into the queue in the same manner.

Sample Experimental Results

The running time of DeepSAT was compared with the running time of a popular modern SAT solver called MINI-SAT2. Specifically, multiple types of unsatisfiable SAT problems having different problem sizes were used in the experiment. Because these SAT problems are unsatisfiable, the task for the SAT solver was to find a refutation. The types of SAT problems that were tested included the Pigeonhole problem, the XOR reordering problem, and the multiplier equivalence/correctness problem. In many problem instances, MINISAT2 timed out, whereas DeepSAT was able to find a refutation. For problem instances in which MINISAT2 was able to find a refutation, DeepSAT was able to find a refutation in significantly less time than MINISAT2.

Figure 4:
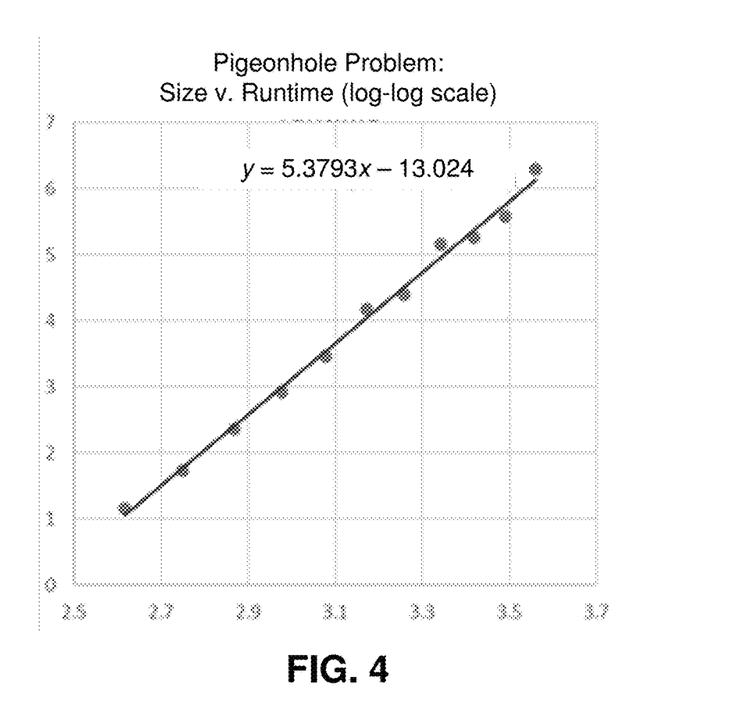
FIG. 4 illustrates a log-log plot of problem size versus runtime for the pigeonhole problem in accordance with some embodiments described herein.

FIG. 4 illustrates a log-log plot of problem size versus runtime for the pigeonhole problem in accordance with some embodiments described herein. The pigeonhole problem asserts that P pegs must be placed in P−1 holes, which is obviously not possible. However, when this problem is modeled as a SAT problem, many traditional SAT solvers have a hard time finding a refutation. In FIG. 4, the X-axis is the logarithm of the number of terms in the pigeonhole SAT problem, and the Y-axis is the logarithm of the amount of time in seconds that it took DeepSAT to find a refutation. For comparison, MINISAT2 timed out after running for 5 days for SAT pigeonhole problems that had greater than or equal to 14 pegs (which corresponds to the 4 rightmost data points on the log-log plot). Note that the log-log plot in FIG. 4 fits a line having slope 5.3793. Therefore, this experimental result shows that DeepSAT can solve the pigeonhole SAT problem in runtime $O(N^{5.4})$.

Figure 5:
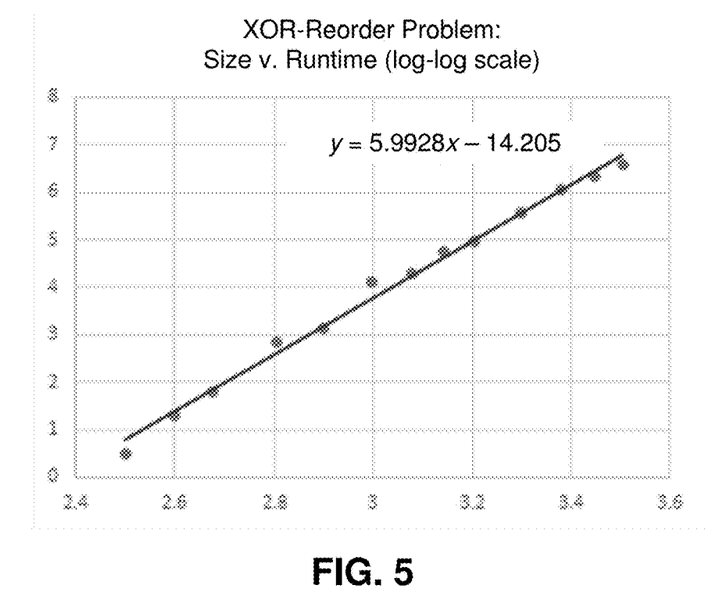
FIG. 5 illustrates a log-log plot of problem size versus runtime for the XOR-reorder problem in accordance with some embodiments described herein.

FIG. 5 illustrates a log-log plot of problem size versus runtime for the XOR-reorder problem in accordance with some embodiments described herein. The XOR-reorder problem asserts that N variables exclusive-or-ed together in 2 different random orders have different results for some input, which is obviously not true because of the associative and commutative properties of the XOR operation. However, when this problem is modeled as a SAT problem, many traditional SAT solvers have a hard time finding a refutation. In FIG. 5, the X-axis is the logarithm of the number of terms in the XOR-reorder SAT problem, and the Y-axis is the logarithm of the amount of time in seconds that it took DeepSAT to find a refutation. For comparison, MINISAT2 timed out after running for 5 days for SAT XOR-reorder problems that had greater than or equal to 80 variables, whereas DeepSAT was able to find a solution for problem sizes as large as 400 variables. Note that the log-log plot in FIG. 5 fits a line having slope 5.9928. Therefore, this experimental result shows that DeepSAT can solve the XOR-reorder SAT problem in runtime $O(N^6)$.

Figure 6:
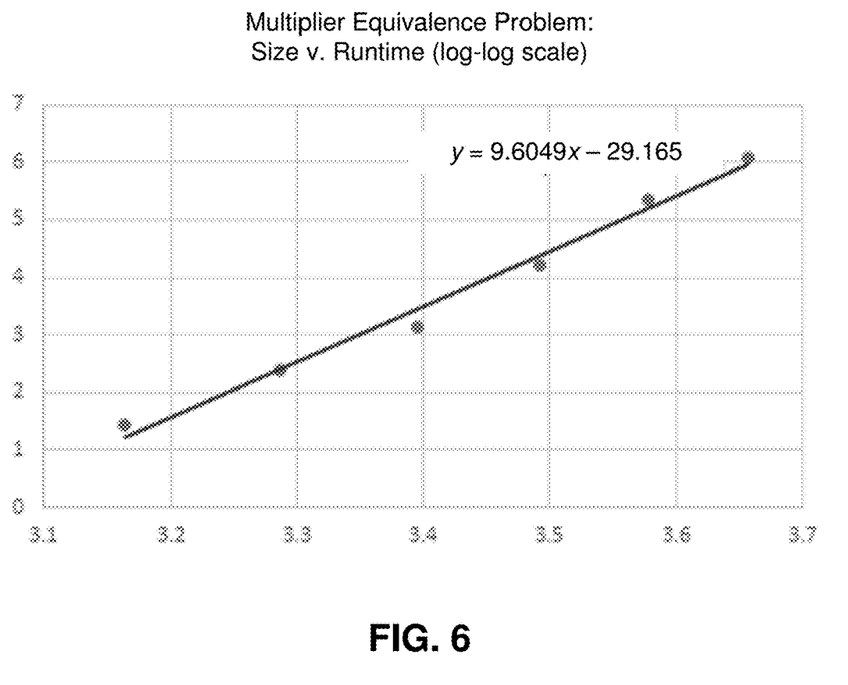
FIG. 6 illustrates a log-log plot of problem size versus runtime for the randomized multiplier equivalence problem in accordance with some embodiments described herein.

FIG. 6 illustrates a log-log plot of problem size versus runtime for the randomized multiplier equivalence problem in accordance with some embodiments described herein. The randomized multiplier equivalence problem asserts that two different randomly generated multipliers get different results for some input, which again is not true because different, albeit correct, multiplier implementations should produce the same output for the same inputs. While modeling the SAT problem, to prevent the simple enumeration refutation in the SAT model, the product plane is used directly as input, with no input bits feeding the product plane with bit AND logic. To make the SAT problem hard, partial sums and carry bits at each level are scrambled by a randomly generated 3-tree of full adders. When the randomized multiplier equivalence problem is modeled as a SAT problem as described above, many traditional SAT solvers have a hard time finding a refutation. In FIG. 6, the X-axis is the logarithm of the number of terms in the randomized multiplier equivalence SAT problem, and the Y-axis is the logarithm of the amount of time in seconds that it took DeepSAT to find a refutation. For comparison, MINISAT2 timed out after running for 5 days for randomized multiplier equivalence SAT problems that had greater than or equal to 3785 terms, whereas DeepSAT was able to find a solution for problem sizes that had 4537 terms. Note that the log-log plot in FIG. 6 fits a line having slope 9.6049. Therefore, this experimental result shows that DeepSAT can solve the XOR-reorder SAT problem in runtime $O(N^{9.7})$.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A non-transitory computer-readable storage medium storing instructions that, when executed by a computer, cause the computer to perform a method for solving a technological problem, the method comprising:
constructing a Boolean satisfiability (SAT) problem based on the technological problem;
maintaining a database that stores clauses that are used while solving the SAT problem;
solving the SAT problem by generating an extended resolution proof, wherein each new variable is defined as a Boolean OR of a pair of literals involving existing variables, and the pair of literals are chosen as a most common pair occurring in the clauses in the database; and
using a solution to the SAT problem to solve the technological problem.

2. The non-transitory computer-readable storage medium of claim 1, wherein new variables are substituted for pairs of literals in clauses in the database whenever possible.

3. The non-transitory computer-readable storage medium of claim 1, wherein conflict-driven-clause learning is used to derive new clauses by resolution.

4. The non-transitory computer-readable storage medium of claim 3, wherein a phase of a branched literal is chosen randomly.

5. The non-transitory computer-readable storage medium of claim 3, wherein a phase of a branched literal is chosen to satisfy a maximum number of clauses in the database.

6. The non-transitory computer-readable storage medium of claim 1, wherein loop resolution is used to derive new clauses by resolution.

7. The non-transitory computer-readable storage medium of claim 6, wherein redundancy of a new clause is tested, and the new clause is not added if the new clause is determined to be redundant.

8. The non-transitory computer-readable storage medium of claim 7, wherein redundancy of the new clause is tested against only length-2 and original problem clauses.

9. The non-transitory computer-readable storage medium of claim 7, wherein redundancy of the new clause is tested against only length-2, length-3, and original problem clauses.

10. The non-transitory computer-readable storage medium of claim 6, wherein search for loops is done by expansion from clauses in the database.

11. The non-transitory computer-readable storage medium of claim 10, wherein the clauses to be expanded are managed by a priority queue, sorted by a metric indicating desirability of expanding the clauses.

12. The non-transitory computer-readable storage medium of claim 11, wherein the metric includes a size of a clause to be generated.

13. The non-transitory computer-readable storage medium of claim 11, wherein the metric includes a size of a clause to be expanded.

14. The non-transitory computer-readable storage medium of claim 11, wherein the metric includes a position of a clause to be expanded in a proof being generated.

15. The non-transitory computer-readable storage medium of claim 1, wherein the technological problem is one of: combinational equivalence checking, automatic test-pattern generation, model checking, planning in artificial intelligence, or haplotyping in bioinformatics.

16. The non-transitory computer-readable storage medium of claim 1, wherein the technological problem is an integrated circuit (IC) design verification problem during an IC design and manufacturing process, and wherein upon solving the IC design verification problem, subsequent steps in the IC design and manufacturing process that result in an IC chip are performed.

17. A non-transitory computer-readable storage medium storing instructions that, when executed by a computer, cause the computer to perform a method for solving a technological problem, the method comprising:
constructing a Boolean satisfiability (SAT) problem based on the technological problem;
maintaining a database that stores clauses that are used while solving the SAT problem;
solving the SAT problem by generating an extended resolution proof, wherein new variables are defined only when a resolution method fails to generate clauses of a predefined type; and
using a solution to the SAT problem to solve the technological problem.

18. The non-transitory computer-readable storage medium of claim 17, wherein the technological problem is one of: combinational equivalence checking, automatic test-pattern generation, model checking, planning in artificial intelligence, or haplotyping in bioinformatics.

19. A non-transitory computer-readable storage medium storing instructions that, when executed by a computer, cause the computer to perform a method for solving a technological problem, the method comprising:
constructing a Boolean satisfiability (SAT) problem based on the technological problem;
maintaining a database that stores clauses that are used while solving the SAT problem;
solving the SAT problem by generating an extended resolution proof, wherein new variables are defined only when a resolution method fails to generate clauses of a predefined type at a rate that is greater than a threshold; and
using a solution to the SAT problem to solve the technological problem.

20. The non-transitory computer-readable storage medium of claim 19, wherein the technological problem is one of: combinational equivalence checking, automatic test-pattern generation, model checking, planning in artificial intelligence, or haplotyping in bioinformatics.

* * * * *

UNITED STATES PATENT AND TRADEMARK OFFICE
CERTIFICATE OF CORRECTION

PATENT NO. : 10,650,109 B1
APPLICATION NO. : 16/264098
DATED : May 12, 2020
INVENTOR(S) : William Clark Naylor, Jr.

Page 1 of 1

It is certified that error appears in the above-identified patent and that said Letters Patent is hereby corrected as shown below:

In the Specification

At Column 6, Line 31, please delete the words "variables, "I" means Boolean" and replace with "variables, "|" means Boolean"

Signed and Sealed this
Tenth Day of November, 2020

Andrei Iancu
*Director of the United States Patent and Trademark Office*